United States Patent
Hinderer et al.

(10) Patent No.: US 12,184,249 B2
(45) Date of Patent: Dec. 31, 2024

(54) ACTIVE GROUND BOUNCE NOISE CANCELATION TECHNIQUE FOR CLOSED LOOP ANALOG REGULATION

(71) Applicant: Infineon Technologies AG, Neubiberg (DE)

(72) Inventors: Thorsten Hinderer, Neubiberg (DE); Andrei Negoita, Constanta (RO)

(73) Assignee: Infineon Technologies AG, Neubiberg (DE)

( * ) Notice: Subject to any disclaimer, the term of this patent is extended or adjusted under 35 U.S.C. 154(b) by 536 days.

(21) Appl. No.: 17/518,141

(22) Filed: Nov. 3, 2021

(65) Prior Publication Data

US 2023/0136057 A1    May 4, 2023

(51) Int. Cl.
| | | |
|---|---|---|
| H03F 3/45 | (2006.01) | |
| H03F 1/26 | (2006.01) | |
| H03F 3/72 | (2006.01) | |

(52) U.S. Cl.
CPC ........... *H03F 3/45179* (2013.01); *H03F 1/26* (2013.01); *H03F 3/72* (2013.01); *H03F 2200/372* (2013.01)

(58) Field of Classification Search
CPC .......... H03F 3/45179; H03F 1/26; H03F 3/72; H03F 2200/372; H03F 3/2173; H03F 3/45183; H03F 2200/186; H03F 2200/189; H03F 2203/45318; H03F 2203/45366; H03F 3/45475
USPC ........................................ 330/252, 253, 254
See application file for complete search history.

(56) References Cited

U.S. PATENT DOCUMENTS

| | | | | |
|---|---|---|---|---|
| 4,429,283 A | * | 1/1984 | Wittlinger | ........... H03F 3/45179 330/253 |
| 2005/0277826 A1 | * | 12/2005 | Dunseath | ............... A61B 5/369 600/410 |

OTHER PUBLICATIONS

Rahimi et al., "Application Note AN-1162," retrieved from https://www.infineon.com/dgdl/an-1162.pdf?fileld=5546d462533600a40153559a8e17111a on Aug. 31, 2021, 36 pp.
Infineon Technologies AG, "ILD2111 Design Guide," document reference AN_201406_PL21_002_V1.1, May 6, 2015, 53 pp.
Infineon Technologies AG, "XMC4000/1000," V1.0, Jan. 2015, 93 pp.

* cited by examiner

*Primary Examiner* — Andrea Lindgren Baltzell
*Assistant Examiner* — Khiem D Nguyen
(74) *Attorney, Agent, or Firm* — Shumaker & Sieffert, P.A.

(57) ABSTRACT

A differential feedback circuit with an active noise cancelation technique using a dual input differential pair. In the differential feedback circuit, a feedback voltage and a reference voltage connect to a primary input pair. Sensed noise at the inputs is put to a secondary input pair of the differential amplifier, which is inverted with respect to the primary input pair. In other words, the reference voltage, which may be subject to noise, connects directly to one terminal of the secondary input pair and through a low-pass filter to another terminal of the secondary input pair so that the noise, which may be coupled to the differential feedback circuit, cancels at the output of the differential feedback circuit.

19 Claims, 6 Drawing Sheets

ACTIVE GROUND BOUNCE NOISE CANCELATION TECHNIQUE FOR CLOSED LOOP ANALOG REGULATION

TECHNICAL FIELD

The disclosure relates to differential feedback integrated circuits, and more specifically, active noise cancelation for differential circuits.

BACKGROUND

Some circuitry uses differential amplifiers for feedback. For example, a circuit with an output may include circuitry to compare the output to a reference using, for example, a differential amplifier. For a voltage controlled circuit, the inputs to the differential amplifier may be a reference voltage and a sampled output voltage. The output of the differential amplifier may be considered an error signal, which may connect to an input of a feedback loop configured to make adjustments to the output voltage.

SUMMARY

In general, the disclosure describes a differential feedback circuit with an active noise cancelation technique using a dual input differential pair. In the differential feedback circuit, the feedback voltage and a reference voltage connect to the primary input pair. The signals with sensed noise may be put to a secondary input pair of the differential feedback circuit. The secondary input pair may be inverted with respect to the primary input pair so that the noise cancels out at the output of the error amplifier. In some examples, the output of the differential feedback circuit may be received by a switched mode power supply (SMPS) circuit and used as part of a feedback loop to manage the output voltage of the SMPS.

In one example, the disclosure describes a differential feedback circuit comprising: an output terminal, a dual input differential pair configured for active noise cancelation comprising a primary input terminal pair and a secondary input terminal pair, wherein a polarity of the secondary input terminal pair is inverted relative to a polarity of the primary input terminal pair, wherein: the primary input terminal pair comprises a first terminal and a second terminal, the primary input pair connected to: a reference voltage at the first terminal, wherein the reference voltage is liable to be affected by a noise signal and a feedback voltage at the second terminal, and the secondary input terminal pair comprising a third terminal and a fourth terminal, the secondary input pair connected to: the reference voltage at the third terminal, and the reference voltage through a low pass filter connected between the fourth terminal and the second terminal, wherein the output terminal of the differential amplifier is configured to deliver an output signal comprising a sum of signals at the primary input terminal pair and the secondary input terminal pair, to cancel the effect of the noise signal.

In another example, the disclosure describes a system comprising: processing circuitry, a power converter circuit comprising a power stage, the power converter circuit configured to provide power to the processing circuitry, a differential feedback circuit comprising: an output terminal configured to provide an error signal to control the operation of the power stage for the power converter circuit, a dual input differential pair configured for active noise cancelation comprising a primary input terminal pair and a secondary input terminal pair, wherein a polarity of the secondary input terminal pair is inverted relative to a polarity of the primary input terminal pair, wherein: the primary input terminal pair comprises a first terminal and a second terminal, the primary input pair connected to: a reference voltage at the first terminal, wherein the reference voltage is liable to be affected by a noise signal and a feedback voltage at the second terminal, and the secondary input terminal pair comprising a third terminal and a fourth terminal, the secondary input pair connected to: the reference voltage at the third terminal, and the reference voltage through a low pass filter connected to the fourth terminal and the second input terminal, wherein the output terminal of the differential feedback circuit is configured to deliver the error signal: comprising a sum of signals at the primary input terminal pair and the secondary input terminal pair, to cancel the effect of the noise signal.

In another example, the disclosure describes a method comprising: receiving, by a primary input terminal pair of a dual input differential feedback circuit: a reference voltage at a first terminal, and a feedback voltage at a second terminal, wherein the primary input terminal pair comprises the first terminal and the second terminal, and wherein the dual input differential feedback circuit is configured for active noise cancelation of a noise signal coupled to the differential feedback circuit, receiving, by a secondary input terminal pair of the dual input differential feedback circuit, wherein the secondary input pair comprises a third terminal and a fourth terminal: the reference voltage at the third terminal, and the reference voltage through a low pass filter connected to the fourth terminal and the second terminal, wherein the secondary input terminal pair is inverted in polarity with respect to the primary input terminal pair, and providing, by an output terminal of the differential feedback circuit a sum of signals received at the primary input terminal pair and the secondary input terminal pair, to cancel the effect of the noise signal.

The details of one or more examples of the disclosure are set forth in the accompanying drawings and the description below. Other features, objects, and advantages of the disclosure will be apparent from the description and drawings, and from the claims.

DETAILED DESCRIPTION

Figure 1:
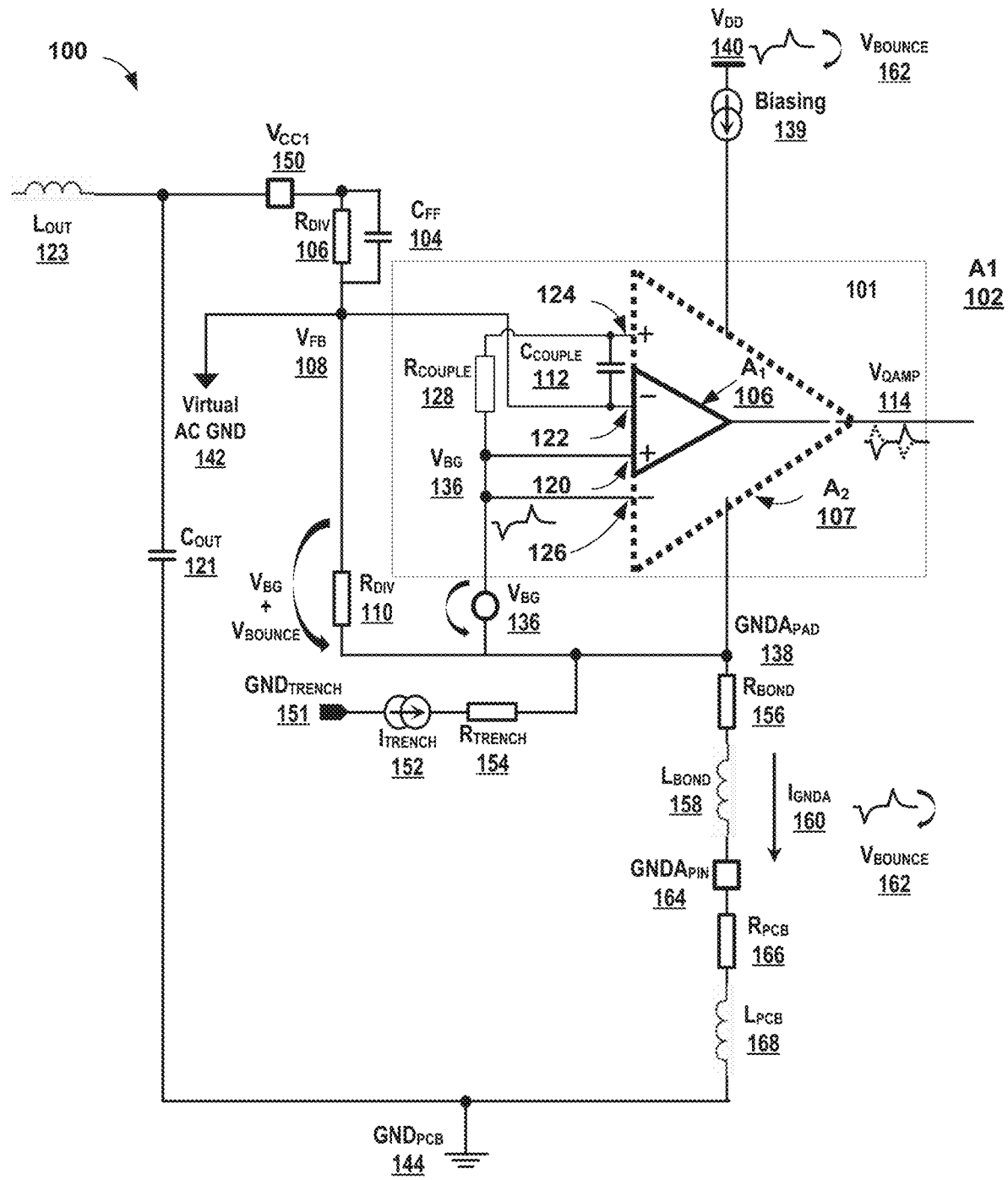
FIG. 1 is a schematic diagram illustrating an example circuit including a feedback circuit with a dual input differential pair.

A differential feedback circuit with an active noise cancelation technique using a dual input differential pair. In the differential feedback circuit, the feedback voltage and a reference voltage connect to the primary input pair. The input signals that may be subject to sensed noise are put to a second input pair of the differential feedback circuit, which is inverted with respect to the primary input pair, so that the noise cancels at the output of the error amplifier. The circuit arrangement of the differential feedback circuit of this disclosure may reduce the noise component at the output terminal to a low enough value such that the noise may not affect downstream use of the differential feedback circuit output. In some examples, the noise component may be reduced to approximately zero. In some examples, the output of the differential feedback circuit may be received by a switched mode power supply (SMPS) circuit and used as part of a feedback loop to manage the output voltage of the SMPS.

In some examples, the differential feedback circuit of this disclosure may be implemented as a dual input differential amplifier circuit. Sources of the noise received by the differential amplifier may include noise coupled to the differential amplifier, e.g., through a common semiconductor substrate of an integrated circuit. In some examples, switching activity elsewhere in a circuit may be coupled to input terminals of the differential amplifier. Some signals may be susceptible to noise, such as ground bounce, caused especially by high-speed switching activity. For example, a high-speed differential amplifier may be desirable as an error amplifier for a high bandwidth SMPS, like a buck DC-DC converter. Ground bounce from switching activities may be conducted through the error amplifier as an input error signal and not filtered out as a common mode transient. The result may cause an offset in the error amplifier output terminal, and wrong output voltage of the error amplifier which may lead to generating inappropriate duty cycle with a ramp generator of the SNIPS. In some examples, the amplified offset error may lead to unexpected pulse skipping behavior while operating in constant current mode (CCM). In some examples, the offset error may also result in an offset in the generated SNIPS output voltage, as well as higher SNIPS output voltage ripple.

The circuit arrangement of the differential amplifier of this disclosure may provide advantages over other techniques to resolve output errors caused by noise. The circuit of this disclosure may require fewer leads and smaller footprint of the circuit package containing the integrated circuit that includes the differential feedback circuit, when compared to other circuit arrangements.

Other circuit arrangements may include circuit layouts that seek to minimize parasitic inductance on the SMPS power and analog ground leads by means of a layout of a printed circuit board (PCB) that includes the IC containing the SMPS. However, PCB layout solutions may not provide an integrated solution, e.g., provide a SNIPS IC with high bandwidth and less liable to be affected by a noise signal. Still other examples may include an IC package solution, such as to attempt to minimize parasitic inductance on GNDP and GNDA leads by means of using multiple leads for those IC pins. However, multiple leads and larger package footprint may be more expensive to produce and to use. Another example may include adding an input filter and/or capacitive noise coupling for a single input differential pair. However, such filtering may require additional loop stability compensation in the compensation circuit, which will reduce the bandwidth of the SMPS.

FIG. 1 is a schematic diagram illustrating an example circuit including a feedback circuit with a dual input differential pair. The example of circuit 100 illustrates one possible use case for the feedback circuit of this disclosure, which uses a dual input differential amplifier circuit 101 with an active noise cancelation technique. In other examples, circuit 100 and differential amplifier circuit 101 may have more components, fewer components or different components than shown in the example of FIG. 1.

Error amplifier 101 comprises a differential amplifier with a dual input differential pair configured for active noise cancelation. Error amplifier 101, in the example of FIG. 1, is shown as a dual differential amplifier comprising a primary amplifier A1 106 and secondary amplifier A2 107. Error amplifier 101 also includes a primary input terminal pair and a secondary input terminal pair. The polarity of the secondary input terminal pair is inverted relative to a polarity of the primary input terminal pair. The primary input terminal pair includes a first non-inverting terminal 120 and a second inverting terminal 122. The primary input pair connects to reference voltage Vbg 136 at the first terminal 120 and to feedback voltage Vfb 108 at the second terminal 122.

In the example of FIG. 1, the secondary input terminal pair includes a third inverting terminal 126 and a fourth non-inverting terminal 124. The secondary input pair connects to reference voltage Vbg 136 at the third terminal 126. The fourth terminal 124 connects to feedback voltage Vib 108 through coupling capacitor Ccouple 112. Fourth terminal 124 also connects through Rcouple 128 to reference voltage Vbg 136 at first terminal 120. In the example of error amplifier 101, Vbg 136 connects directly to first terminal 122 and the third terminal 126 of the secondary input pair. Vbg 136 connects to the fourth terminal 124 of the secondary input pair through a low pass filter. The low pass filter includes coupling capacitor 112 connected between second terminal 122 and fourth terminal 124. The low pass filter also includes coupling resistor 128 connected between fourth terminal 124 and reference voltage Vbg 136, e.g., at first terminal 120. The ground for the low pass filter is Vfb 108, which also may be considered the virtual AC ground 142. In this manner, as noted above, the input signal that may be subject to sensed noise, e.g., reference voltage Vbg 108, is put to the secondary input pair of the differential feedback circuit, which, in the example of FIG. 1, includes a dual input differential amplifier.

The low pass filter may also be considered a high pass filter with respect to Vfb 108. In other words, the feedback voltage Vfb 108 connects through a high pass filter connected between the second terminal 122 of the primary input pair, the fourth terminal 124 of the secondary input pair and the reference voltage Vbg 136 at the first terminal 120 of the first input pair. With respect to Vfb 108, the ground for the high pass filter is reference voltage Vbg 136.

In some examples, reference voltage Vbg 136 may be exposed to a noise signal Vbounce 162. Error amplifier 101 may be implemented in an integrated circuit formed in a common semiconductor substrate with other circuitry. The integrated circuit may be connected to various off-chip components, e.g., Cout 121, Lout 123, or other off-chip components. In some examples, activity in other circuits on the common substrate, e.g., high frequency switching activity, may cause Vbounce 162 to be coupled into error amplifier 101. In some examples error amplifier 101 may be configured as a high-speed differential amplifier and may conduct Vbounce 162 to output terminal $V_{OAMP}$ 114 rather than attenuating Vbounce 162 as a common mode transient. In some examples Vbounce 162 may cause an offset at the output terminal of error amplifier 101. In the example in which error amplifier 101 is used with a SMPS, the offset at error amplifier 101 may also result in pulse skipping behavior while operating in constant current mode (CCM), an offset in the generated SMPS output voltage, as well as higher SNIPS output voltage ripple.

However, with the arrangement of error amplifier 101, the output terminal is configured to deliver output signal $V_{QAMP}$ 114, which includes a sum of signals at the primary input terminal pair and the secondary input terminal pair, but also to act to cancel the effect of the noise signal. In other words, $V_{QAMP}$ 114 may include the sum of Vbg 136 and Vfb 108 from the primary input terminal pair, 120 and 122, as well as the sum of the filtered. Vfb 108 and. Vbg 136 at the secondary input terminal pair, 124 and 126. Because the polarity of the secondary input terminal pair is inverted relative to a polarity of the primary input terminal pair, the noise signal, Vbounce 162, may be attenuated at the output. In some examples, noise signal Vbounce 162 may be attenuated enough such that the output signal, $V_{QAMP}$ 114 may be subject to an offset voltage that is small enough such that noise signal Vbounce 162 may not affect circuit operation.

A current $I_{GNDA}$ 160 may flow from a ground connection within the integrated circuit, SNDA-PAD 138 through several parasitic components caused by the connections between the IC and the PCB. The example of FIG. 1 models the parasitic components as Rbond 156, Lbond 158, connecting the IC to the IC leadframe and Rpcb 166 and Lpcb 168 connecting the IC leadframe to the PCB, GND-PCB 144, e.g., with conductive adhesive, solder and so on. In some examples, these parasitic components may be modeled as being in the range of 1 nano-Henry (nH) and 1 mΩ, respectively.

In the example of circuit 100, Vfb 108 provides a signal to monitor voltage Vcc1 150, e.g., sample Vcc1 150, at a terminal on the leadframe of the IC that includes error amplifier 101. In the example of FIG. 1, Vfb 108 is reduced from Vcc1 150 by a resistor divider including Rdiv 106 and Rdiv 110. The resistor divider may be part of a compensation network including capacitor Cif 104. Rdiv 106 connects between IC pad Vcc1 150 and Vfb 108, which is connected to terminal 122 as well as a first terminal of Rdiv 110. Vfb 108 may be considered a virtual AC ground 142. Rdiv 110 connects Vfb 108 to IC ground, GNDA-PAD 138. The voltage across Rdiv 110 is lag 136 plus Vbounce 162.

GND-trench 151 is modeled as connected to GNDA-Pad 138 through Rtrench 154. Electrical current Itrench 152 comes from GND-trench 151 through Rtrench 154. External to the IC, Cout 121 connects Vcc1 150 to GND-PCB 144. Lout 123 also connects to Vcc1 150. Vdd 140 provides power to error amplifier 101 and may be biased by biasing current 139.

Figure 2:
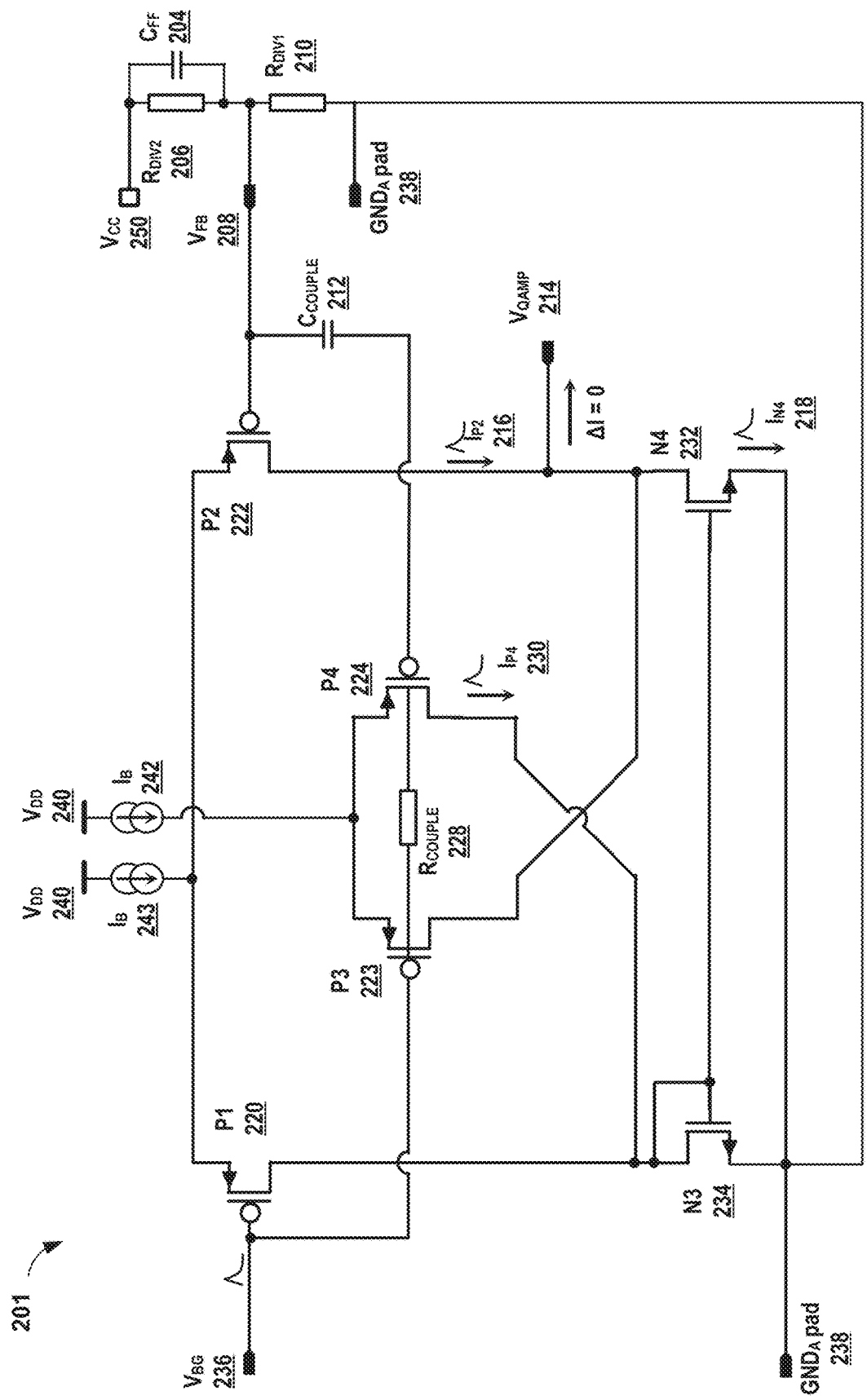
FIG. 2 is a schematic diagram illustrating an example implementation of the dual input differential pair amplifier according to one or more techniques of this disclosure.

FIG. 2 is a schematic diagram illustrating an example implementation of the dual input differential pair amplifier according to one or more techniques of this disclosure. Error amplifier 201 is an example of error amplifier 101 described above in relation to FIG. 1. The primary input terminal pair for error amplifier 201 includes a first terminal connected to reference voltage Vbg 236, the gate terminal of transistor P1 220. Reference voltage Vbg 236 may be affected by a noise signal, as described above in relation to FIG. 1. Feedback voltage Vfb 208 connects to the second terminal, the gate terminal of transistor P2 222. A source terminal of P1 220 connects to a source of P2 222. Vdd 240 connects to the sources of P1 220 and P2 222.

The secondary input pair in the example of FIG. 2 are the gate terminals of transistors P2 223 and P4 224. As described above in relation to FIG. 1, reference voltage lag 236 connects to the third terminal, the gate terminal of P2 223. Feedback voltage Vfb 208 connects to the fourth terminal, the gate terminal of P4 224 through coupling capacitor Ccouple 212. Similar to FIG. 1, Rcouple 228 connects between the gate terminal of transistor P4 224 and reference voltage Vbg 236 at the gate terminal of transistor P3 223. Ccouple 212 connects the gate terminal of P2 222 to the gate terminal of P4 224. A source terminal of P3 223 connects to a source terminal of P4 224. Vdd 240 connects to the sources of P3 223 and P4 224. In some examples, bias currents Ib 242 and lb 243 may be equal. In this disclosure, the tennis gate and gate terminal are equivalent, as are source and source terminal, and so on.

As described above in relation to FIG. 1. Vbg 236, which may be subject to noise, connects directly to third terminal P2 233 of the secondary input pair and through a low pass filter to fourth terminal P4 224 of the secondary input pair. The low pass filter is formed by Rcouple 228 and Ccouple 212.

In the example of FIG. 2, transistors P1 220, P2 222, P3 223 and P4 224 are P-type metal oxide semiconductor field effect transistors (MOSFET). In other examples, error amplifier 201 may be implemented by replacing the P-type transistors with N-type MOSFETs or with bipolar junction transistors (BJTs) and some rearrangement of circuit elements.

The components of error amplifier 201 form a current mirror with transistors N3 234 and N4 232. Transistors N3 234 and N4 232 are N-type MOSFETs in the example of FIG. 2. The drain of the P1 220 connects to a drain and a gate of transistor N3 234. A drain of P2 222 connects to a drain of MOSFET N4 232. The source of N2 234 and source of N4 232 connect to GNDA-PAD 238, which corresponds to GNDA-PAD 138 described above in relation to FIG. 1.

Similar to circuit 100 depicted in FIG. 1, in the example of error amplifier 201 in FIG. 2, Vfb 208 monitors voltage Vcc 250 at a terminal on the leadframe of the IC including error amplifier 201. Vfb 208 is reduced from Vcc 250 by a resistor divider including Rdiv2 206 and Rdiv1 210. The resistor divider may be part of a compensation network including capacitor Cff 204. Rdiv2 206 connects between IC pad Vcc 250 and Vfb 208, which is connected to the gate of P2 22 as well as a first terminal of Rdiv1 210. Rdiv1 210 connects Vfb 208 to IC ground, GNDA-PAD 238. Capacitor Cff 204 is connected in parallel with Rdiv2 206, between Vcc 250 and Vfb 208.

Output terminal of error amplifier 201 is configured to deliver an output signal, which is the sum of signals at the primary input terminal pair and the secondary input terminal pair and to cancel the effect of the noise signal. In the example of FIG. 2, the current Ip4 230 flows through transistor P4 224. The currents at the output, $V_{QAMP}$ 214, e.g., Ip2 216 and In4 218, may sum at the output to attenuate the effect of the noise signal coupled to error amplifier 201. In some examples, ΔI approximately equals zero. In the disclosure, "approximately" the same means the values are equal, e.g., equal to zero, within measurement and manufacturing tolerances. Manufacturing methods, temperature, different types of materials, changing atmospheric pressures, and other factors can cause some small differences in circuit performance.

Figure 3:
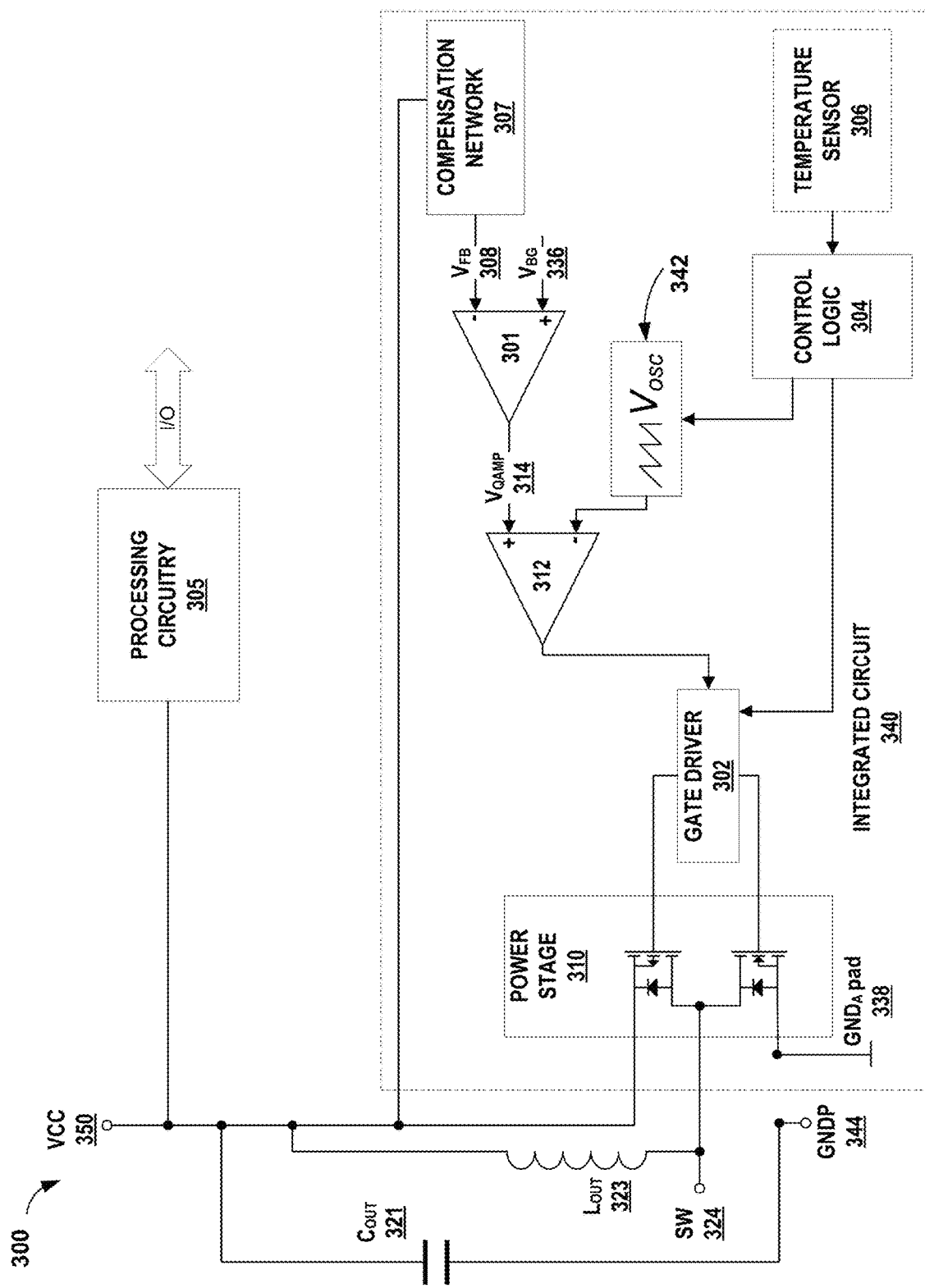
FIG. 3 is a schematic diagram illustrating an example switched mode power supply including a differential amplifier according to one or more techniques of this disclosure.

FIG. 3 is a schematic diagram illustrating an example switched mode power supply including a differential amplifier according to one or more techniques of this disclosure. Error amplifier 301 is an example of error amplifier 101 and 201 described above in relation to FIGS. 1 and 2. Error amplifier 301 may be implemented in an integrated circuit 340 formed in a common semiconductor substrate with other circuitry as depicted in the example of FIG. 3. Though not shown in FIG. 3, in some examples, processing circuitry 305 may be implemented on the same integrated circuit 340 and supported by off-chip components Cout 321 and Lout 323. As described above in relation to FIG. 1, some parasitic inductance and capacitance may exist between GNDA-PAD 238 and GNDP 344 (not shown in FIG. 3).

The example of system 300 includes processing circuitry 305, which may be supplied by a buck DC-DC switched mode power supply. The output of the power supply is Vcc 350, which powers processing circuitry 305. Processing circuitry 305 may perform a variety of functions, have connections for inputs and outputs (I/O), e.g., from sensors or communication circuitry, and provide outputs to control other components in a system. One possible example of processing circuitry 305 may be an engine control unit (ECU) or a body control unit (BCU) for an automobile, motorcycle and similar systems.

Examples of processing circuitry 305 may include any one or more of a microcontroller (MCU), e.g. a computer on a single integrated circuit containing a processor core, memory, and programmable input/output peripherals, a microprocessor (µP), e.g. a central processing unit (CPU) on a single integrated circuit (IC), a controller, a digital signal processor (DSP), an application specific integrated circuit (ASIC), a field-programmable gate array (FPGA), a system on chip (SoC) or equivalent discrete or integrated logic circuitry. A processor may be integrated circuitry, i.e., integrated processing circuitry, and that the integrated processing circuitry may be realized as fixed hardware processing circuitry, programmable processing circuitry and/or a combination of both fixed and programmable processing circuitry. Accordingly, the terms "processing circuitry," "processor" or "controller," as used herein, may refer to any one or more of the foregoing structures or any other structure operable to perform techniques described herein.

In some examples, the circuit of FIG. 3 may also include memory (not shown in FIG. 3) for storing data, measured values, and programming instructions for processing circuitry 305. Examples of a memory (not shown in FIG. 3) may include any type of computer-readable storage media include random access memory (RAM), read only memory (ROM), programmable read only memory (PROM), erasable programmable read only memory (EPROM), one-time programmable (OTP) memory, electronically erasable programmable read only memory (EEPROM), flash memory, or another type of volatile or non-volatile memory device. In some examples the computer readable storage media may store instructions that cause the processing circuitry to execute the functions described herein. In some examples, the computer readable storage media may store data, such as configuration information, temporary values and other types of data used to perform the functions of this disclosure.

Integrated circuit 340, in the example of FIG. 3, includes power stage 310, gate driver 302, comparator 312, oscillator 342, control logic 304, temperature sensor 306, error amplifier 301 and compensation network 307. Integrated circuit 340 (IC 340) may include integrated circuitry mounted to a lead frame, e.g., with wire bonds, a flip-chip, or other types of circuit packages.

Power stage 310 may include a high-side and low-side transistor driven by gate driver circuit 302. The low-side transistor may also be referred to as the synchronous rectification transistor. Gate driver circuit 302 receives inputs from comparator 312 and control logic 304. In some examples, control logic 304 may receive temperature information from temperature sensor 306. Compensation network 307 is circuitry, such an arrangement of capacitors, resistors, inductors and so on, that connects to the output of the power supply Vcc 350. Compensation network 307 provides feedback voltage Vfb 308 to error amplifier 301 and is configured to help control loop stability and loop response.

Error amplifier 301 is a differential amplifier with a dual input differential pair configured for active noise cancelation, as described above in relation to FIGS. 1 and 2. The secondary input terminal pair is not shown in FIG. 3 to simplify the description. The primary input terminal pair connects to reference voltage Vbg 336 at the non-inverting terminal. As described above in relation to FIG. 1, reference voltage Vbg 336 may be exposed to a noise signal and feedback voltage Vfb 308 connects to a terminal of the secondary input pair through a low pass filter (not shown in FIG. 3). Feedback voltage Vfb 308 also connects to the inverting terminal of error amplifier 301. The output signal $V_{QAMP}$ 314 of error amplifier 301 is the sum of the signals at the primary input terminal pair and the secondary input terminal pair to cancel the effect of the noise signal. In this manner error amplifier 301 of this disclosure may reduce or avoid offset at the error amplifier output terminal. The arrangement of error amplifier 301 may avoid a wrong output voltage, $V_{QAMP}$ 314 from error amplifier 301 which may lead to generating inappropriate duty cycle with a ramp generator, e.g., oscillator 342 of the SMPS of system 300.

Comparator 312 receives $V_{QAMP}$ 314 at the non-inverting input and the output of oscillator 342 at the inverting input. Comparator 312 may output a signal to gate driver 302 that adjusts the switching of power stage 310 based on Vfb 308. Gate driver 302 also receives control signals from control logic 304.

External components Cout 321 and. Lout 323 may be placed external to IC 340, such as on a printed circuit board that includes IC 340 and processing circuitry 305. Inductor Lout 323 connects between the switch node, SW 324 of power stage 310 and Vcc 350. The output capacitor, Cout 322 connects between Vcc 350 and GNDP 344.

Figure 4:
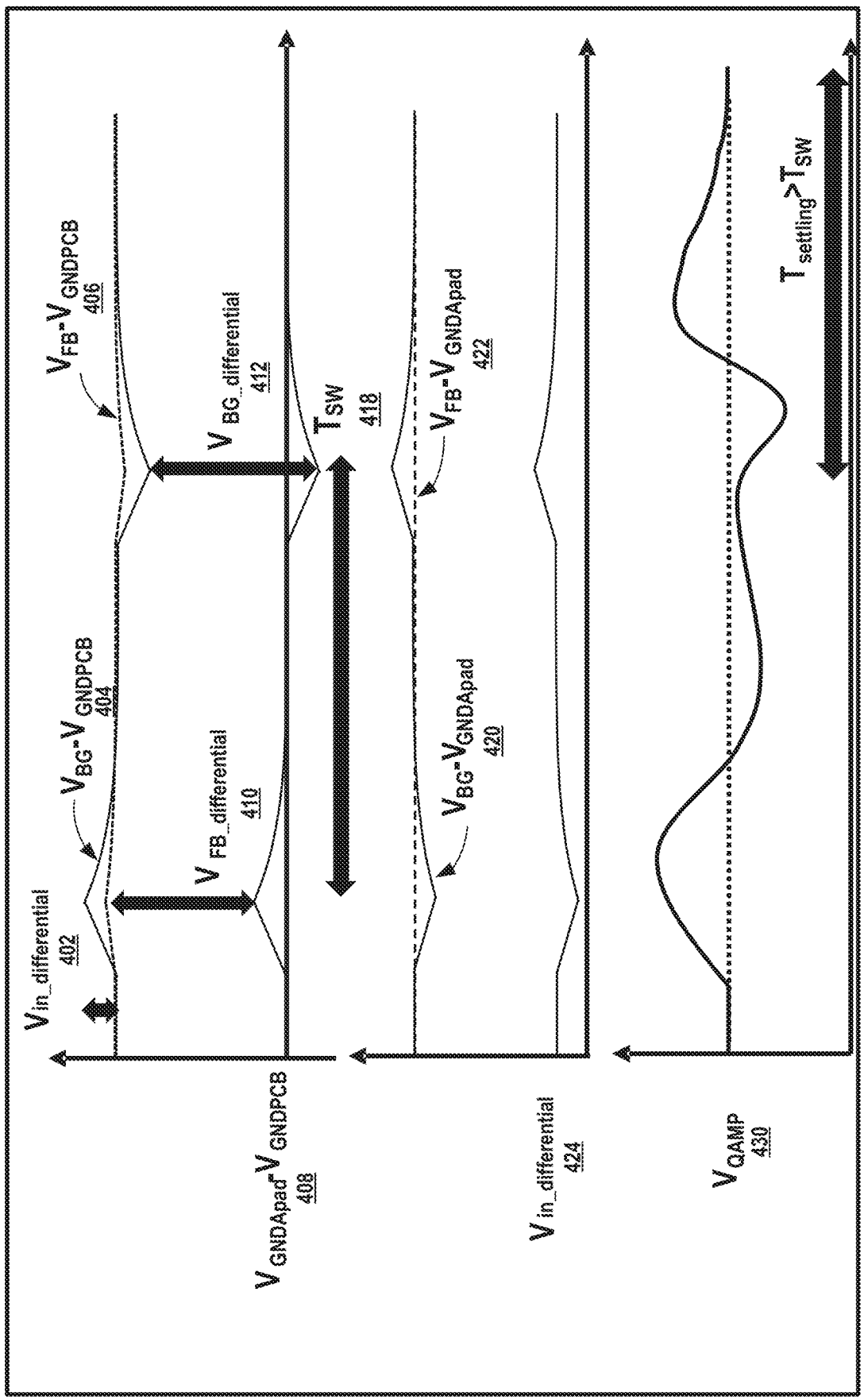
FIG. 4 is a time graph illustrating an example impact of noise on an amplifier circuit.

FIG. 4 is a time graph illustrating an example impact of noise on an amplifier circuit. The example of FIG. 4 may illustrate system 300, described above in relation to FIG. 3, when error amplifier 301 of this disclosure, with an active noise cancelation using a dual input differential pair, is replaced with a different type of differential amplifer.

In a circuit without the noise cancelation techniques of this disclosure, the differential voltage at the input, Vin_differential 402, may be subject to noise as shown by the curves for Vbg-$V_{GNDPCB}$ 404 and Vfb-$V_{GNDPCB}$ 406. As described above in relation to FIG. 1, parasitic elements between GNDA-PAD 138 and GND-PCB 144 may result in Vbounce 162. The noise can be seen in FIG. 4 as Vfb_differential 410 and Vbg_differential 412 and may be the result of switching activity, e.g., switching that occurs during switching period Tsw 418.

In the IC, e.g., IC 340 described above in relation to FIG. 3, reference voltage Vfb may be stable with respect to the IC ground $V_{GNDAApad}$, as shown by Vfb-$V_{GNDAApad}$ 422, e.g., virtual AC ground, as described above in relation to FIG. 1. The reference voltage Vbg with respect to the IC ground, Vbg-$V_{GNDApad}$ 420, and Vin_differential 424 may be susceptible to noise. With the differential amplifier settling time longer than the switching time Tsw 418, the output signal VQAMP 430 may be noisy, and further affect the downstream pulse width modulation of the SMPS power stage, as described above in relation to FIG. 3.

Figure 5:
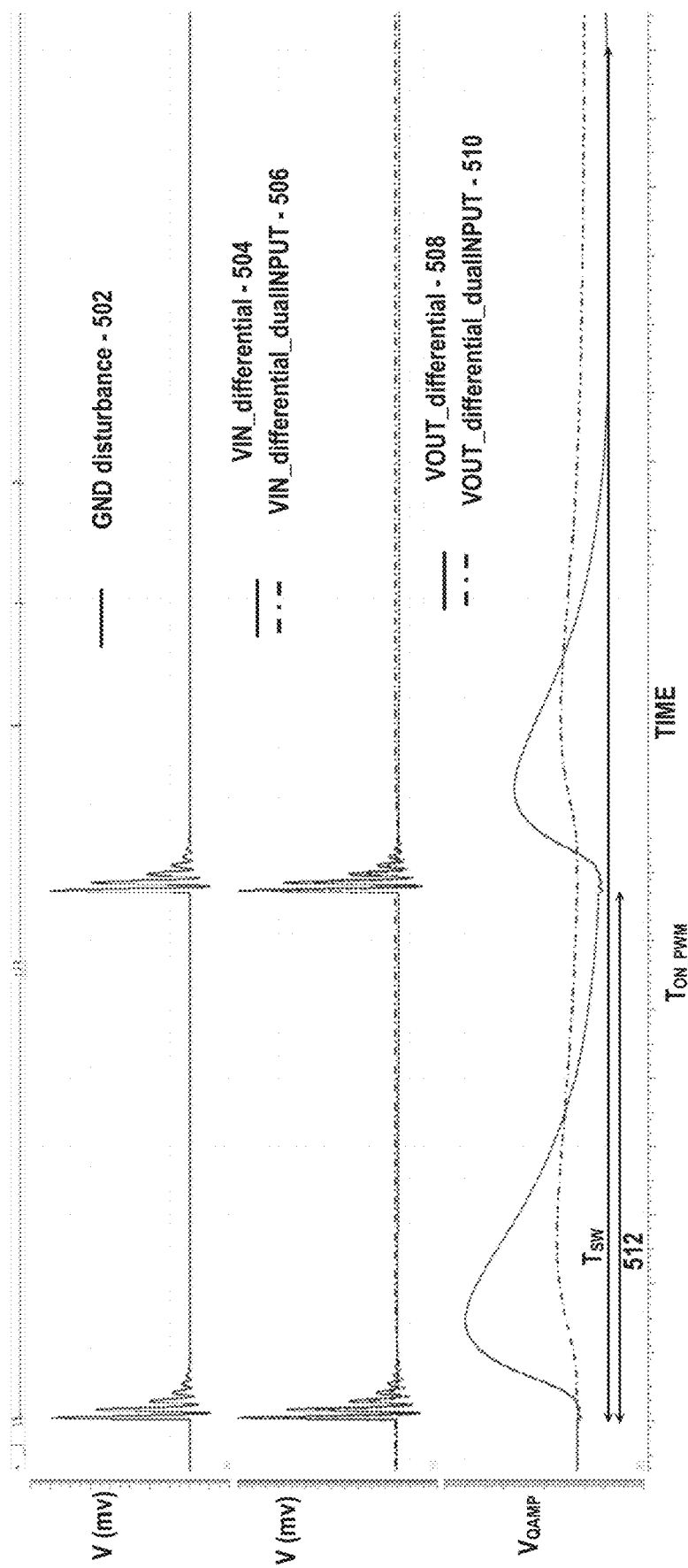
FIG. 5 is a time graph illustrating an example circuit performance with and without the active noise cancellation techniques of this disclosure.

FIG. 5 is a time graph illustrating an example circuit performance with and without the active noise cancellation techniques of this disclosure. The example of FIG. 5 depicts measured inputs and output from a differential amplifier circuit of this disclosure with an active noise cancelation technique using a dual input differential pair. As described above in relation to FIGS. 1-3, the feedback voltage (Vfb) and a reference voltage ($V_{BG}$) connect to the primary input pair. The sensed noise is put to a secondary input pair of the differential amplifier, which is inverted with respect to the primary input pair. In other words, the feedback voltage, through a low-pass filter, and the reference voltage connect to the secondary input pair so that the noise cancels at the output of the error amplifier. FIG. 5 illustrates the output of the amplifier of this disclosure compared to the output of a differential amplifier without the noise cancellation techniques of this disclosure.

An example of noise in a circuit may include ground disturbance 502, e.g., Vbounce. The disturbance applies over the switching period Tsw 512 approximately the same for the dual input differential amplifier, VIN_differential_dualINPUT 506, as for the amplifier without the dual input differential pair of this disclosure, VIN_differential 504. However, noise at the output for the differential amplifier of this disclosure, VOUT_differential_dualINPUT 510 is significantly less than the noise at the output for the other type of amplifier VOUT_differential 508. The arrangement of the circuitry for the dual input differential amplifier of this disclosure cancels the noise for the output signal. As shown by the example of FIG. 5, the differential amplifier may not cancel the noise completely, e.g., may not cancel the noise to approximately zero. However, the differential amplifier of this disclosure may cancel the noise enough such that noise remaining in the output signal may not affect the operation of downstream circuitry, e.g, the closed loop feedback for a buck DC-DC converter, or some other circuitry that uses a differential amplifier. Other example circuitry that may benefit from the differential amplifier of this disclosure may include a voltage reference for an analog to digital converter (ADC), a low-drop out (LDO) power converter, and so on.

Figure 6:
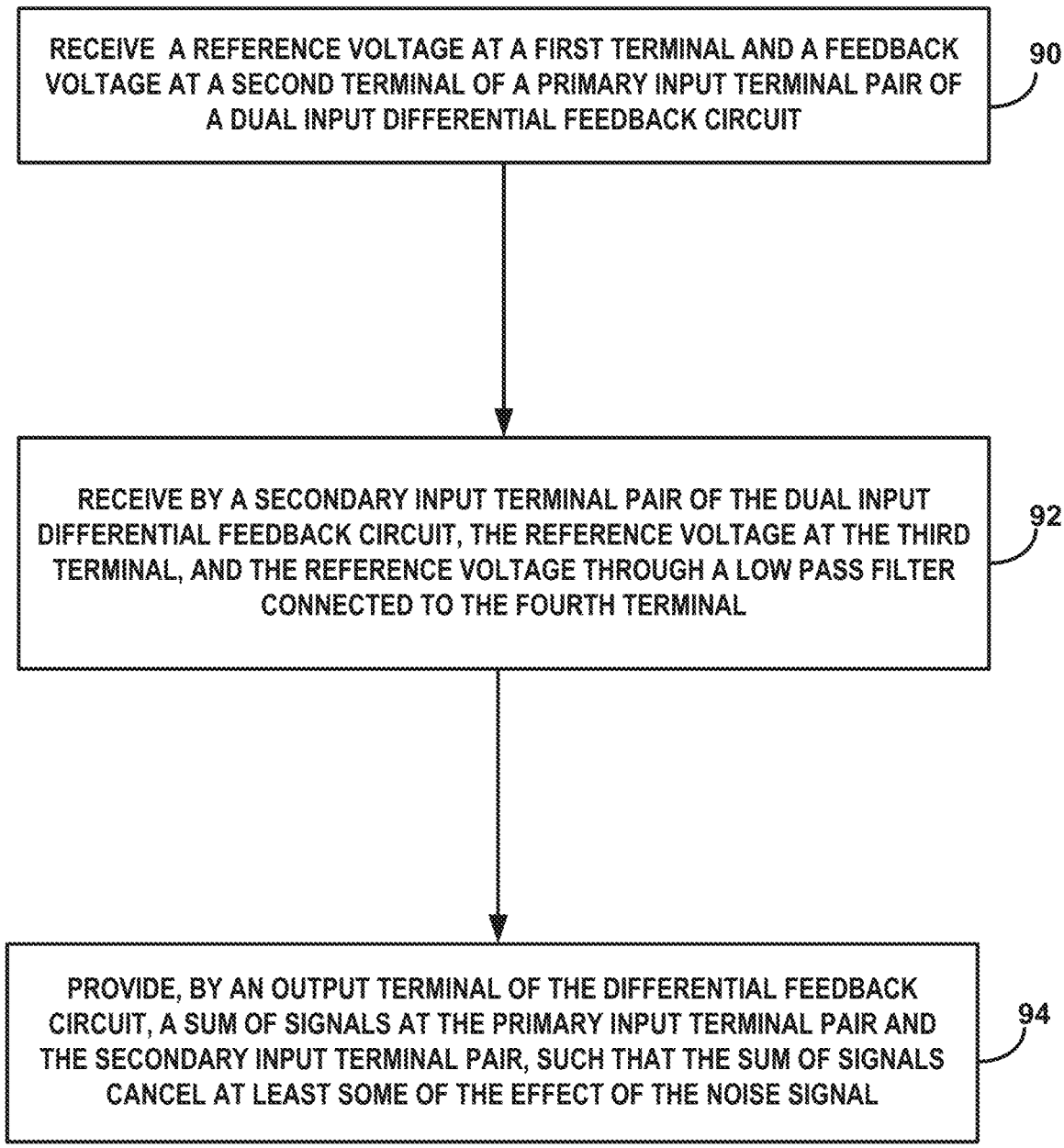
FIG. 6 is a flow diagram illustrating an example operation of the amplifier circuit of this disclosure.

FIG. 6 is a flow diagram illustrating an example operation of the amplifier circuit of this disclosure. The blocks of FIG. 6 will be described in terms of FIGS. 1 and 3, unless otherwise noted. However, other circuits or systems could also perform the techniques of FIG. 6.

According to FIG. 6, the differential feedback circuit including error amplifier 101 may receive reference voltage Vbg 136 at a first terminal 120 of the primary input terminal pair for amplifier A1 106. Feedback voltage Vfb 108 may connect to error amplifier 101 at second terminal 122 (90).

Error amplifier 101 may receive, at the secondary input terminal pair, e.g., of amplifier A2 107, reference voltage Vbg 136 at third terminal 126. Feedback voltage Vfb 108 connects to fourth terminal 124 through Ccouple 112, Reference voltage Vbg 136 also connects to the fourth terminal 124 through a low pass filter, which includes Rcouple 128 and Ccouple 112 in the example of FIG. 1 (92). The secondary input terminal pair is inverted in polarity with respect to the primary input terminal pair.

Error amplifier 101 provide an output signal at the output terminal of the differential amplifier circuit, $V_{OAMP}$ 114, which is a sum of the signals received at the primary input terminal pair as well as at the secondary input terminal pair (94). The arrangement of the circuitry of error amplifier 101 is configured to cancel the effect of the noise signal, at least partially, as described above in relation to FIGS. 2 and 5.

The techniques of this disclosure may also be described in the following clauses.

Clause 1. A differential feedback circuit comprising: an output terminal, a dual input differential pair configured for active noise cancelation comprising a primary input terminal pair and a secondary input terminal pair, wherein a polarity of the secondary input terminal pair is inverted relative to a polarity of the primary input terminal pair, wherein: the primary input terminal pair comprises a first terminal and a second terminal, the primary input pair connected to: a reference voltage at the first terminal, wherein the reference voltage is liable to be affected by a noise signal and a feedback voltage at the second terminal, and the secondary input terminal pair comprising a third terminal and a fourth terminal, the secondary input pair connected to: the reference voltage at the third terminal, and the reference voltage through a low pass filter connected to the fourth terminal and the second terminal, wherein the output terminal of the differential amplifier is configured to deliver an output signal: comprising a sum of signals at the primary input terminal pair and the secondary input terminal pair, to cancel the effect of the noise signal.

Clause 2: The circuit of clause 1, wherein the low pass filter comprises: a coupling capacitor connected between the second terminal and the fourth terminal; and a coupling resistor connected between the fourth terminal and the reference voltage.

Clause 3: The circuit of any of clauses 1 and 2, wherein the: first terminal is a non-inverting terminal; the second terminal is an inverting terminal; the third terminal is an inverting terminal; and the fourth terminal is a non-inverting terminal.

Clause 4: The circuit of any combination of clauses 1 through 3, wherein the feedback voltage is connected to a compensation circuit.

Clause 5: The circuit of any combination of clauses 1 through 4, wherein the circuit is implemented in an integrated circuit formed in a common semiconductor substrate.

Clause 6: The circuit any combination of clauses 1 through 5, wherein: the first terminal connects to a gate of a first metal oxide semiconductor field effect transistor (MOSFET), the second input terminal connects to a gate of a second MOSFET, a source of the first MOSFET connects to a source of the second MOSFET.

Clause 7: The circuit of any combination of clauses 1 through 6, wherein: the third terminal connects to a gate of a third MOSFET, the fourth terminal connects to a gate of a fourth MOSFET, a source of the third MOSFET connects to a source of the fourth MOSFET.

Clause 8: The circuit of any combination of clauses 1 through 7 includes the first MOSFET, the second MOSFET, a fifth MOSFET and a sixth MOSFET, wherein, a drain of the second MOSFET connects to a drain of the sixth MOSFET, a drain of the first MOSFET connects to a drain and a gate of the fifth MOSFET.

Clause 9: The circuit of any combination of clauses 1 through 8, wherein the output teiminal connects to the drain of the second MOSFET and the drain of the sixth MOSFET.

Clause 10: The circuit of any combination of clauses 1 through 9, wherein: a drain of the first MOSFET connects to a drain of the fourth MOSFET a drain of the second MOSFET connects to a drain of the third MOSFET.

Clause 11. A system comprising: processing circuitry, a power converter circuit comprising a power stage, the power converter circuit configured to provide power to the processing circuitry, a differential feedback circuit comprising: an output terminal configured to provide an error signal to control the operation of the power stage for the power converter circuit, a dual input differential pair configured for active noise cancelation comprising a primary input terminal pair and a secondary input terminal pair, wherein a polarity of the secondary input terminal pair is inverted relative to a polarity of the primary input terminal pair, wherein: the primary input terminal pair comprises a first terminal and a second terminal, the primary input pair connected to: a reference voltage at the first terminal, wherein the reference voltage is liable to be affected by a noise signal and a feedback voltage at the second terminal, and the secondary input terminal pair comprising a third terminal and a fourth terminal, the secondary input pair connected to: the reference voltage at the third terminal, and the reference voltage through a low pass filter connected to the fourth terminal and the second terminal, wherein the output terminal of the differential feedback circuit is configured to deliver the error signal: comprising a sum of signals at the primary input terminal pair and the secondary input terminal pair, to cancel the effect of the noise signal.

Clause 12: The system of clause 11 wherein the power stage comprises a high-side switch and a low-side switch.

Clause 13: The system of any of clauses 11 and 12, wherein the circuit is implemented in an integrated circuit formed in a common semiconductor substrate.

Clause 14: The system of any of clauses 1.1 through 13, wherein the feedback voltage is derived from the power supplied to the processing circuitry.

Clause 15: The system of any of clauses 11 through 14, wherein the low pass filter comprises: a coupling capacitor connected between first terminal and the fourth terminal; and a coupling resistor connected between the fourth terminal and the reference voltage.

Clause 16: The system of any of clauses 11 through 15, wherein the: first terminal is a non-inverting terminal; the second terminal is an inverting terminal; the third terminal is an inverting terminal; and the fourth terminal is a non-inverting terminal.

Clause 17: The system of any of clauses 11 through 16, wherein: the first terminal connects to a gate of a first metal oxide semiconductor field effect transistor (MOSFET), the second input terminal connects to a gate of a second MOSFET, a source of the first MOSFET connects to a source of the second MOSFET.

Clause 18: The system of any of clauses 11 through 17, the third terminal connects to a gate of a third MOSFET, the fourth terminal connects to a gate of a fourth MOSFET, a source of the third MOSFET connects to a source of the fourth MOSFET.

Clause 19: A method includes receiving, by a primary input terminal pair of a dual input differential feedback circuit: a reference voltage at a first terminal; and a feedback voltage at a second terminal, wherein the primary input terminal pair comprises the first terminal and the second terminal, and wherein the dual input differential feedback circuit is configured for active noise cancelation of a noise signal coupled to the differential feedback circuit; receiving, by a secondary input terminal pair of the dual input differential feedback circuit, wherein the secondary input pair comprises a third terminal and a fourth terminal: the reference voltage at the third terminal, and the reference voltage through a low pass filter connected to the fourth terminal and the second terminal, wherein the secondary input terminal pair is inverted in polarity with respect to the primary input terminal pair; and providing, by an output terminal of the differential amplifier circuit a sum of signals at the primary input terminal pair and the secondary input terminal pair, to cancel the effect of the noise signal.

Clause 20: The method of clause 19, further comprising controlling the operation of a power stage for a power converter circuit based on the output voltage.

In one or more examples, the functions described above may be implemented in hardware, software, firmware, or any combination thereof. For example, some components of FIG. 3 may be implemented in hardware, software, firmware, or any combination thereof. If implemented in software, the functions may be stored on a tangible computer-readable storage medium and executed by a processor or hardware-based processing unit.

Instructions may be executed by one or more processors, such as one or more digital signal processors (DSPs), general purpose microprocessors, application specific integrated circuit (ASIC). Field programmable gate array (FPGAs), or other equivalent integrated or discrete logic circuitry. Accordingly, the term "processor," and "processing circuitry" as used herein, such as may refer to any of the foregoing structure or any other structure suitable for implementation of the techniques described herein. Also, the techniques could be fully implemented in one or more circuits or logic elements.

The techniques of this disclosure may be implemented in a wide variety of devices or apparatuses, including a wireless handset, an integrated circuit (IC) or a set of ICs (e.g., a chip set). Various components, modules, or units are described in this disclosure to emphasize functional aspects of devices configured to perform the disclosed techniques, but do not necessarily require realization by different hardware units. Rather, as described above, various units may be combined in a hardware unit or provided by a collection of interoperative hardware units, including one or more processors as described Various examples of the disclosure have been described. These and other examples are within the scope of the following claims.

What is claimed is:

1. A differential amplifier circuit, the circuit comprising:
an output terminal;
a dual input differential pair configured for active noise cancelation comprising a primary input terminal pair and a secondary input terminal pair, wherein a polarity of the secondary input terminal pair is inverted relative to a polarity of the primary input terminal pair, wherein:
the primary input terminal pair comprises a first terminal and a second terminal, the primary input pair connected to:
a reference voltage at the first terminal, wherein the reference voltage is liable to be affected by a noise signal, and
a feedback voltage at the second terminal, and
the secondary input terminal pair comprising a third terminal and a fourth terminal, the secondary input pair connected to:
the reference voltage at the third terminal, and
the reference voltage through a low pass filter connected to the fourth terminal and the second terminal,
wherein:
the first terminal connects to a gate of a first metal oxide semiconductor field effect transistor (MOSFET),
the second input terminal connects to a gate of a second MOSFET, and
a source of the first MOSFET connects to a source of the second MOSFET; and a current mirror, wherein the current mirror comprises:
   the first MOSFET;
   the second MOSFET; and
   a fifth MOSFET and a sixth MOSFET, wherein,
      a drain of the second MOSFET connects to a drain of the sixth MOSFET, and
      a drain of the first MOSFET connects to a drain and a gate of the fifth MOSFET,
wherein the output terminal of the differential amplifier is configured to deliver an output signal:
   comprising a sum of signals at the primary input terminal pair and the secondary input terminal pair;
   to cancel an effect of the noise signal.

2. The circuit of claim 1, wherein the low pass filter comprises:
   a coupling capacitor connected between the second terminal and the fourth terminal; and
   a coupling resistor connected between the fourth terminal and the reference voltage.

3. The circuit of claim 1, wherein the:
   first terminal is a non-inverting terminal;
   the second terminal is an inverting terminal;
   the third terminal is an inverting terminal; and
   the fourth terminal is a non-inverting terminal.

4. The circuit of claim 1, wherein the feedback voltage is connected to a compensation circuit.

5. The circuit of claim 1, wherein the circuit is implemented in an integrated circuit formed in a common semiconductor substrate.

6. The circuit of claim 1, wherein:
   the third terminal connects to a gate of a third MOSFET,
   the fourth terminal connects to a gate of a fourth MOSFET, and
   a source of the third MOSFET connects to a source of the fourth MOSFET.

7. The circuit of claim 1, wherein the output terminal connects to the drain of the second MOSFET and the drain of the sixth MOSFET.

8. The circuit of claim 6, wherein:
   a drain of the first MOSFET connects to a drain of the fourth MOSFET, and
   a drain of the second MOSFET connects to a drain of the third MOSFET.

9. A system comprising:
processing circuitry;
a power converter circuit comprising a power stage, the power converter circuit configured to provide power to the processing circuitry;
a differential feedback circuit comprising:
   an output terminal configured to provide an error signal to control operation of the power stage for the power converter circuit;
   a dual input differential pair configured for active noise cancelation comprising a primary input terminal pair and a secondary input terminal pair, wherein a polarity of the secondary input terminal pair is inverted relative to a polarity of the primary input terminal pair, wherein:
      the primary input terminal pair comprises a first terminal and a second terminal, the primary input pair connected to:
         a reference voltage at the first terminal, wherein the reference voltage is liable to be affected by a noise signal, and
         a feedback voltage at the second terminal, and
      the secondary input terminal pair comprising a third terminal and a fourth terminal, the secondary input pair connected to:
         the reference voltage at the third terminal, and
         the reference voltage through a low pass filter connected to the fourth terminal and the second input terminal;
   wherein the output terminal of the differential feedback circuit is configured to deliver the error signal:
      comprising a sum of signals at the primary input terminal pair and the secondary input terminal pair;
      to cancel an effect of the noise signal.

10. The system of claim 9, wherein the power stage comprises a high-side switch and a low-side switch.

11. The system of claim 9, wherein the circuit is implemented in an integrated circuit formed in a common semiconductor substrate.

12. The system of claim 9, wherein the feedback voltage is derived from the power supplied to the processing circuitry.

13. The system of claim 9, wherein the low pass filter comprises:
   a coupling capacitor connected between first terminal and the fourth terminal; and
   a coupling resistor connected between the fourth terminal and the reference voltage.

14. The system of claim 9, wherein the:
   first terminal is a non-inverting terminal;
   the second terminal is an inverting terminal;
   the third terminal is an inverting terminal; and
   the fourth terminal is a non-inverting terminal.

15. The system of claim 9, wherein:
   the first terminal connects to a gate of a first metal oxide semiconductor field effect transistor (MOSFET),
   the second input terminal connects to a gate of a second MOSFET, and
   a source of the first MOSFET connects to a source of the second MOSFET.

16. The system of claim 9,
   the third terminal connects to a gate of a third MOSFET,
   the fourth terminal connects to a gate of a fourth MOSFET, and
   a source of the third MOSFET connects to a source of the fourth MOSFET.

17. A method comprising:
receiving, by a primary input terminal pair of a dual input differential feedback circuit:
   a reference voltage at a first terminal; and
   a feedback voltage at a second terminal,
   wherein the primary input terminal pair comprises the first terminal and the second terminal, and
   wherein the dual input differential amplifier circuit is configured for active noise cancelation of a noise signal coupled to the differential feedback circuit;
receiving, by a secondary input terminal pair of the dual input differential feedback circuit, wherein the secondary input pair comprises a third terminal and a fourth terminal:
   the reference voltage at the third terminal, and
   the reference voltage through a low pass filter connected to the fourth terminal and the second terminal,
wherein the secondary input terminal pair is inverted in polarity with respect to the primary input terminal pair; and providing, by an output terminal of the differential amplifier circuit, a sum of signals at the primary input terminal pair and the secondary input terminal pair, to cancel an effect of the noise signal.

18. The method of claim 17, further comprising controlling operation of a power stage for a power converter circuit based on the output voltage.

19. A differential amplifier circuit, the circuit comprising:
an output terminal; and
a dual input differential pair configured for active noise cancelation comprising a primary input terminal pair and a secondary input terminal pair, wherein a polarity of the secondary input terminal pair is inverted relative to a polarity of the primary input terminal pair, wherein:
  the primary input terminal pair comprises a first terminal and a second terminal, the primary input pair connected to:
    a reference voltage at the first terminal, wherein the reference voltage is liable to be affected by a noise signal, and
    a feedback voltage at the second terminal, and
  the secondary input terminal pair comprising a third terminal and a fourth terminal, the secondary input pair connected to:
    the reference voltage at the third terminal, and
    the reference voltage through a low pass filter connected to the fourth terminal and the second terminal,
wherein:
  the first terminal connects to a gate of a first metal oxide semiconductor field effect transistor (MOSFET),
  the second input terminal connects to a gate of a second MOSFET,
  a source of the first MOSFET connects to a source of the second MOSFET,
  the third terminal connects to a gate of a third MOSFET,
  the fourth terminal connects to a gate of a fourth MOSFET,
  a source of the third MOSFET connects to a source of the fourth MOSFET,
  a drain of the first MOSFET connects to a drain of the fourth MOSFET, and
  a drain of the second MOSFET connects to a drain of the third MOSFET, and
wherein the output terminal of the differential amplifier is configured to deliver an output signal:
  comprising a sum of signals at the primary input terminal pair and the secondary input terminal pair;
  to cancel an effect of the noise signal.

\* \* \* \* \*